US008018380B2

(12) United States Patent
Oh et al.

(10) Patent No.: US 8,018,380 B2
(45) Date of Patent: Sep. 13, 2011

(54) SYSTEM AND METHOD FOR MEASURING ANTENNA RADIATION PATTERN IN FRESNEL REGION

(75) Inventors: Soon-Soo Oh, Daejon (KR); Je-Hoon Yun, Daejon (KR); Jung-Ick Moon, Daejon (KR); Joung-Myoun Kim, Daejon (KR); Yong-Heui Cho, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 313 days.

(21) Appl. No.: 12/296,760

(22) PCT Filed: Apr. 10, 2007

(86) PCT No.: PCT/KR2007/001728
§ 371 (c)(1),
(2), (4) Date: Oct. 10, 2008

(87) PCT Pub. No.: WO2007/117108
PCT Pub. Date: Oct. 18, 2007

(65) Prior Publication Data
US 2009/0160706 A1    Jun. 25, 2009

(30) Foreign Application Priority Data

Apr. 10, 2006  (KR) .................. 10-2006-0032487
Sep. 14, 2006  (KR) .................. 10-2006-0089272

(51) Int. Cl.
*H01Q 3/00* (2006.01)
*G01R 29/10* (2006.01)
(52) U.S. Cl. ....................... 342/360; 343/703
(58) Field of Classification Search .................. 342/360; 343/703
See application file for complete search history.

(56) References Cited

U.S. PATENT DOCUMENTS 3,879,733 A * 4/1975 Hansen et al. ............... 342/360
(Continued)

FOREIGN PATENT DOCUMENTS

JP  04-282465  10/1992
(Continued)

OTHER PUBLICATIONS

Jeffrey A. Fordham, "An Introduction to Antenna Test Ranges, Measurements and Instrumentation", Microwave Instrumentation Technologies, LLC.*

(Continued)

*Primary Examiner* — Thomas H Tarcza
*Assistant Examiner* — Frank McGue
(74) *Attorney, Agent, or Firm* — Kile Park Goekjian Reed & McManus PLLC

(57) ABSTRACT

There is a provided a system for measuring an antenna radiation pattern in a Fresnel region, including: a fixed antenna and a movable antenna located in the Fresnel region to acquire a far-field radiation pattern; a moving unit for moving upward or downward to adjust a measuring angle of the movable antenna; a rotation unit to rotate a rotation shaft horizontally; a vector network analyzing unit for outputting an radio frequency (RF) signal to one of the fixed antenna and the movable antenna as a transmission antenna, receiving the RF signal received through the other one of the fixed antenna and the movable antenna as a receiving antenna, and detecting a complex value; a control and communication unit for controlling the vector network analyzing unit and a control unit, and performing a data communication; and the control unit for providing a vertical/horizontal rotation force to the moving unit and the rotation unit under a control of the control and communication unit.

7 Claims, 5 Drawing Sheets

U.S. PATENT DOCUMENTS

| | | | | |
|---|---|---|---|---|
| 4,201,987 | A | | 5/1980 | Tricoles et al. |
| 4,998,112 | A | * | 3/1991 | Franchi et al. ............... 342/360 |
| 5,229,776 | A | * | 7/1993 | Kelly et al. .................. 342/173 |
| 5,379,048 | A | * | 1/1995 | Kaufman ..................... 343/765 |
| 5,825,331 | A | * | 10/1998 | Lee ............................... 343/703 |
| 6,285,330 | B1 | * | 9/2001 | Perl .............................. 343/703 |
| 6,850,851 | B1 | * | 2/2005 | Fourestie et al. .............. 702/65 |
| 7,119,739 | B1 | * | 10/2006 | Struckman .................. 342/174 |

FOREIGN PATENT DOCUMENTS

| | | |
|---|---|---|
| JP | 05-133989 | 5/1993 |
| JP | 05-142276 | 6/1993 |
| JP | 2000-338155 | 12/2000 |
| JP | 2004-354362 | 12/2004 |
| KR | 10-2004-0055671 | 6/2004 |
| KR | 10-2005-0113772 | 12/2005 |
| KR | 10-2006-0023246 | 3/2006 |
| KR | 10-2006-0080314 | 7/2006 |

OTHER PUBLICATIONS

Weisstein, Eric W. "Tangent." From MathWorld—A Wolfram Web Resource. http://mathworld.wolfram.com/Tangent.html (1999-2010).*

International Search Report for PCT/KR2007/001728 dated Jul. 5, 2007.

Gary Evans, "Far Field Correction for Short Antenna Ranges", Proceedings of AMTA, pp. 34-1 to 34-9, 1985.

Soon-Soo Oh et al., "Large Antenna Measurement in Fresnel Region using Direct Far-Field Measurement System", 12th International symposium on Antenna Technology and Appl. Electromagnetics (ANTEM) and Canadian Radio Sciences Conference (URSI/CNC), pp. 79-81, Jul. 2006.

Reconstruction of antenna radiation pattern by suing data of measurements in a Fresnel region with test facility intended for far-rield measurements, (Antenna, 92/1, 46-92, Jan. 2005), pp. 46-52.

* cited by examiner

SYSTEM AND METHOD FOR MEASURING ANTENNA RADIATION PATTERN IN FRESNEL REGION

TECHNICAL FIELD

The present invention relates to a system and method for measuring an antenna radiation pattern in a Fresnel region; and, more particularly, to a system and method for measuring a far distance radiation pattern by changing a measurement height of an antenna upward or downward differently from a conventional process in a Fresnel region as an intermediate region between a far distance and a short distance.

BACKGROUND ART

A reflector antenna for a satellite or an array antenna which arrays a plurality of single elements has a larger size than a single antenna about dozens times. Accordingly, a minimum gap distance $R_{far}$ between a source antenna and a measuring antenna should satisfy $R_{far} = 2 L^2/\lambda$ in order to acquire a far distance radiation pattern. Here, L is a length of an aperture plane of the measuring antenna, and $\lambda$ is a wavelength of an operating frequency. For example, a minimum gap distance of a far distance radiation pattern of an antenna, which is operated at 10 GHz frequency and has a length of 20 $\lambda$, is 24 m. Therefore, it is impossible to measure a radiation pattern in a smaller anechoic chamber than the minimum gap distance.

A field measuring method is used as an alternative method for the above method. However, the field measuring method is sensitive to weather, and may generate an interference and problem between conventional communication services. Moreover, in a case of an antenna for a military or a security, the field measuring method has a demerit that it is difficult to maintain a secret by being exposed to a spy satellite. There is a compact range method as another alternative method which generates a plane wave by transmitting a wave from the source antenna to a reflector at a measuring point. The compact range method needs a reflector antenna which is expensive and quite difficult to be attached or detached. The compact range method has problems that it is difficult to install and maintain the reflector since an area of the reflector increases at a low frequency band of hundreds of MHz, and it is difficult to satisfy a process error of $\mu m$ at a high frequency above 100 GHz when the reflector is manufactured.

Meanwhile, a short field measuring method, which measures near electric field and converts the measured near electric field into a short distance pattern, may be considered. After measuring vertical and horizontal polarized waves at a distance of 3-10×, this method acquires a far distance pattern by performing a Fourier transform. However, this method needs a lot of resources since instrument member moving a probe needs precision.

Accordingly, it is required a method which measures a large antenna without installing a high cost system or an additional anechoic chamber where there is a conventional far distance region measuring anechoic chamber. A method for converting measured radiation pattern in a Fresnel region into a far distance radiation pattern is published after measuring a radiation pattern in a Fresnel region (a partial distance of $R=2 L^2/\lambda$) which is a middle region between a far distance region and a short distance region. Here, after changing an angle of the measuring antenna upward or downward and measuring the radiation pattern at various cross sections, the measured data is summed based on an equation. It is proved that this method has a high accuracy through various published documents. However, this method has some demerits under a real measuring environment. Firstly, when an angle of a large antenna of dozens kilograms (kg) is changed upward or downward, a safety accident may occur due to the weight of the antenna. Further, if an angle of the measuring antenna is changed upward or downward, this method may generate a measuring error by receiving all unpreferable reflective waves which are reflected from an absorbing body attached to a bottom plane and a ceiling plane. Accordingly, generally, a measuring method for minimizing a reflective wave toward a bottom plane and a ceiling plane by using a source antenna having a high directivity is requested in a Fresnel region.

DISCLOSURE

Technical Problem

An embodiment of the present invention is directed to providing a system and method for measuring an antenna radiation pattern in a Fresnel region in order to acquire a far distance radiation pattern by using a conventional far-field measuring system at a Fresnel region of an anechoic chamber which may not satisfy a far distance region condition due to various factors, e.g., a frequency or a size of an antenna.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided a system for measuring an antenna radiation pattern in a Fresnel region, including: a fixed antenna and a movable antenna located in the Fresnel region, for acquiring a far-field radiation pattern; a moving unit moving upward or downward, for adjusting a measuring angle of the movable antenna; a rotation unit for rotating a rotation shaft horizontally; a vector network analyzing unit for outputting an radio frequency (RF) signal to one of the fixed antenna and the movable antenna as a transmission antenna, receiving the RF signal received through the other as a receiving antenna, and detecting a complex value; a control and communication unit for controlling the vector network analyzing unit and a control unit, and performing a data communication; and the control unit for providing a vertical/horizontal rotation force to the moving unit and the rotation unit under a control of the control and communication unit.

In accordance with an aspect of the present invention, there is provided a method for measuring an antenna radiation pattern in a Fresnel region, including the steps of: determining a measuring parameter; changing a measuring height by moving a movable antenna upward or downward; measuring an antenna radiation by rotating a rotation shaft horizontally using the movable antenna at a predetermined height, acquiring a complex value and storing the acquired complex value in a database; performing the step of measuring the antenna radiation by moving the movable antenna at all height; and calculating a far-field radiation pattern.

The present invention acquires an accurate far-field radiation pattern by maximally using a conventional far-field measuring system in a Fresnel region, which is an intermediate distance of a near field and a far-field, in case that the far-field condition may not be satisfied (That is, in case that a far-field radiation pattern of a large antenna having a large electrical aperture is wanted to be calculated within an anechoic chamber having a limited distance which is not satisfied by a far-field condition). The measurement is performed at a plurality of cross sections, and the corresponding cross section is determined by changing a measuring height of an antenna upward or downward.

The advantages, features and aspects of the invention will become apparent from the following description of the embodiments with reference to the accompanying drawings, which is set forth hereinafter.

Advantageous Effects

The present invention as mentioned above reduces a cost by manually moving a movable antenna upward or downward. Although the present invention implements the movable antenna automatically by using a motor, the present invention reduces a cost since a movable shaft is perpendicular.

Moreover, the present invention improves utility of an installed reference antenna since a partner antenna (generally, a reference horn antenna or a reference dipole antenna) of the antenna to be measured does not need a high directivity.

BEST MODE FOR THE INVENTION

Figure 1:
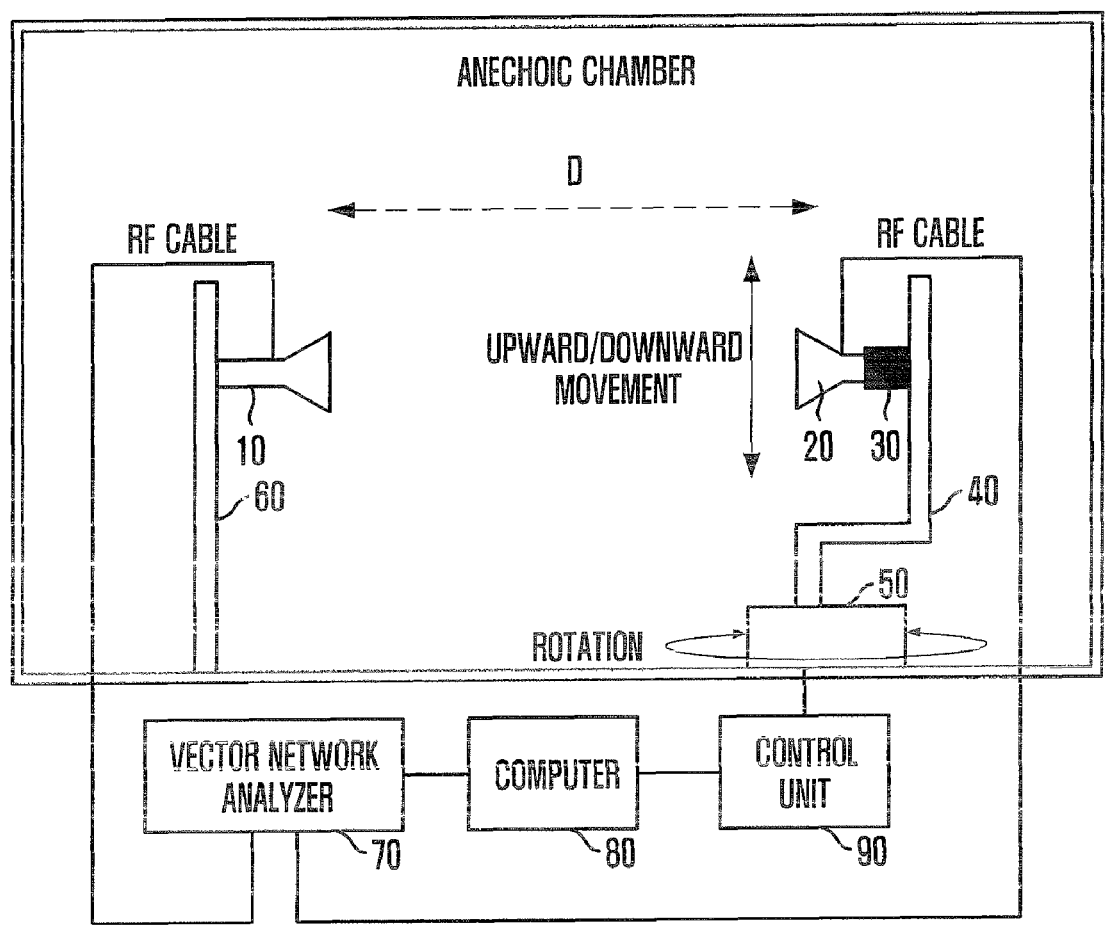
FIG. 1 is a block diagram of a system for measuring antenna radiation pattern in a Fresnel region in accordance with an embodiment of the present invention.
Figure 2:
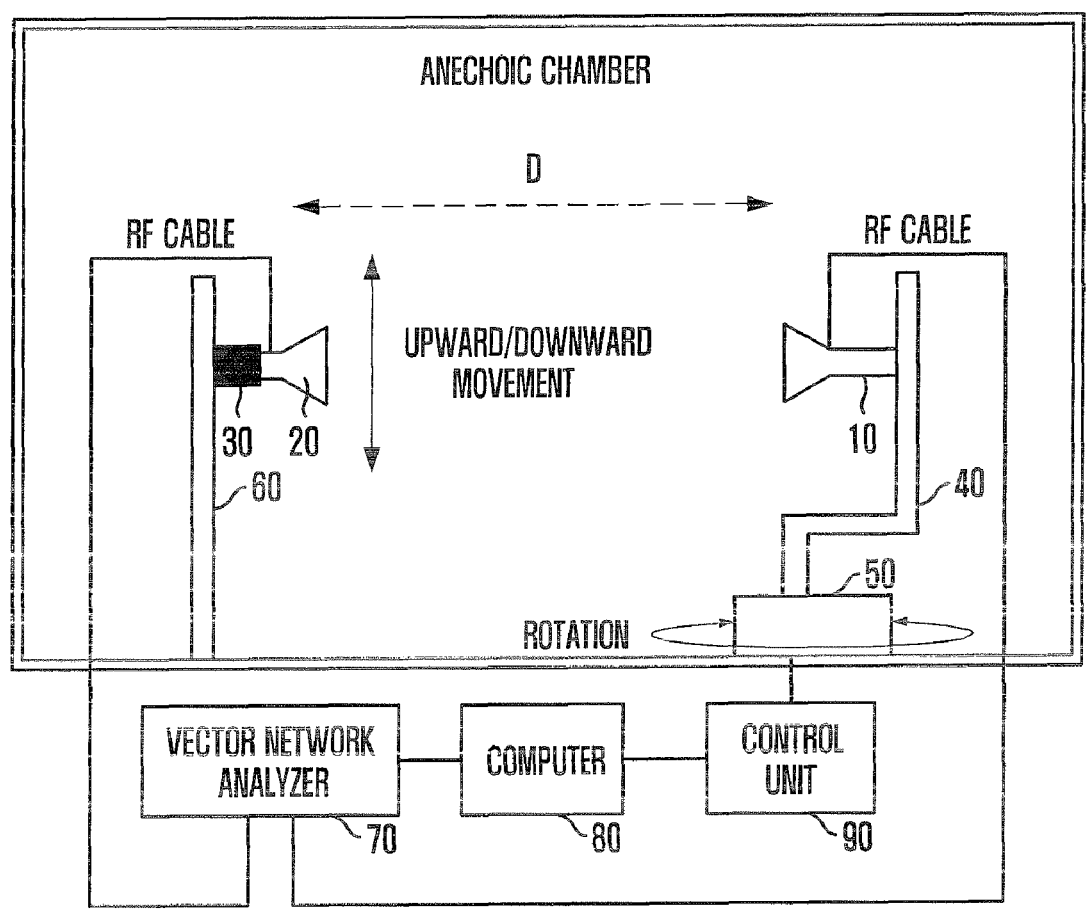
FIG. 2 is a block diagram of a system for measuring an antenna radiation pattern in a Fresnel region in accordance with another embodiment of the present invention.

FIG. 1 is a block diagram of a system for measuring antenna radiation pattern in a Fresnel region in accordance with an embodiment of the present invention and FIG. 2 is a block diagram of a system for measuring an antenna radiation pattern in a Fresnel region in accordance with another embodiment of the present invention.

The block diagrams shown in FIGS. 1 and 2 are similar to a conventional far-field measuring system since the present invention uses the conventional measuring system as much as possible.

As shown in FIGS. 1 and 2, a system for measuring an antenna radiation pattern in a Fresnel region includes two measuring antennas (a fixed antenna 10 and a movable antenna 20), a moving device 30, a rotation device 50, a vector network analyzer (hereinafter, called as a 'VNA') 70, a computer 80 and a control unit 90. The measuring antennas are installed to be apart from each other as long as a distance D within a Fresnel region in order to acquire a far-field radiation pattern. The moving device 30 moves the movable antenna 20 upward or downward to adjust an angle of the movable antenna 20 by changing a measuring height of the movable antenna 20. The rotation device 50 rotates a rotation shaft 40 horizontally to acquire data according to a rotation angle. The VNA 70 outputs a radio frequency (RF) signal to a transmission antenna of the fixed antenna 10 or the movable antenna 20. The VNA 70 receives the RF signal, which is received through a receiving antenna of the fixed antenna 10 or the movable antenna 20, through an RF cable and detects a complex value. The computer 80 controls the VAN 70 and the control unit 90, and performs a data communication. The control unit 90 controls a motor to automatically drive the moving device 30 and the rotation device 50.

Here, the moving device 30 and the rotation device 50 are driven by a manual or driven automatically by a motor to shorten a measuring time.

The system for measuring an antenna radiation pattern in a Fresnel region shown in FIG. 1 moves the movable antenna 20 upward or downward, which may change a measuring height of the antenna attached to the rotation shaft 40 rotated by the rotation device 50 horizontally, by using the moving device 30, and measures a radiation of the antenna. On the other hand, the system for measuring an antenna radiation pattern in a Fresnel region shown in FIG. 2 moves the movable antenna 20 upward or downward, which may change a measuring height of the antenna attached to a fixed shaft 60 which is not rotated horizontally by using the moving device 30, and measures a radiation of the antenna.

As shown in FIGS. 1 and 2, in case that the RF signal which is generated in the VNA 70 and transmitted through the RF cable is outputted from the fixed antenna 10 to a free space, the movable antenna 20 is used as a receiving antenna. On the other hand, in case that the RF signal which is generated in the VNA 70 and transmitted through the RF cable is outputted from the movable antenna 20 to a free space, the fixed antenna 10 is used as a receiving antenna.

In FIGS. 1 and 2, a measuring antenna which acquires a far-field radiation pattern is replaced by one of the fixed antenna 10 and the movable antenna 20.

Figure 3:
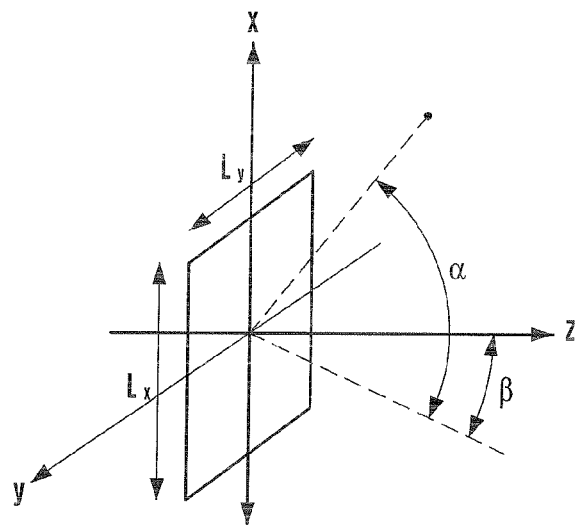
FIG. 3 illustrates angle coordinates of an antenna in accordance with an embodiment of the present invention.

FIG. 3 illustrates angle coordinates of an antenna in accordance with an embodiment of the present invention.

As shown in FIG. 3, $L_x$ denotes a length of an x-axis of the measuring antenna 10 and 20, and $L_y$ denotes a length of a y-axis of the measuring antennas 10 and 20. $\beta$ denotes a vertical angle on an x-z plane and $\alpha$ denotes a vertical angle on a y-z plane.

Figure 4:
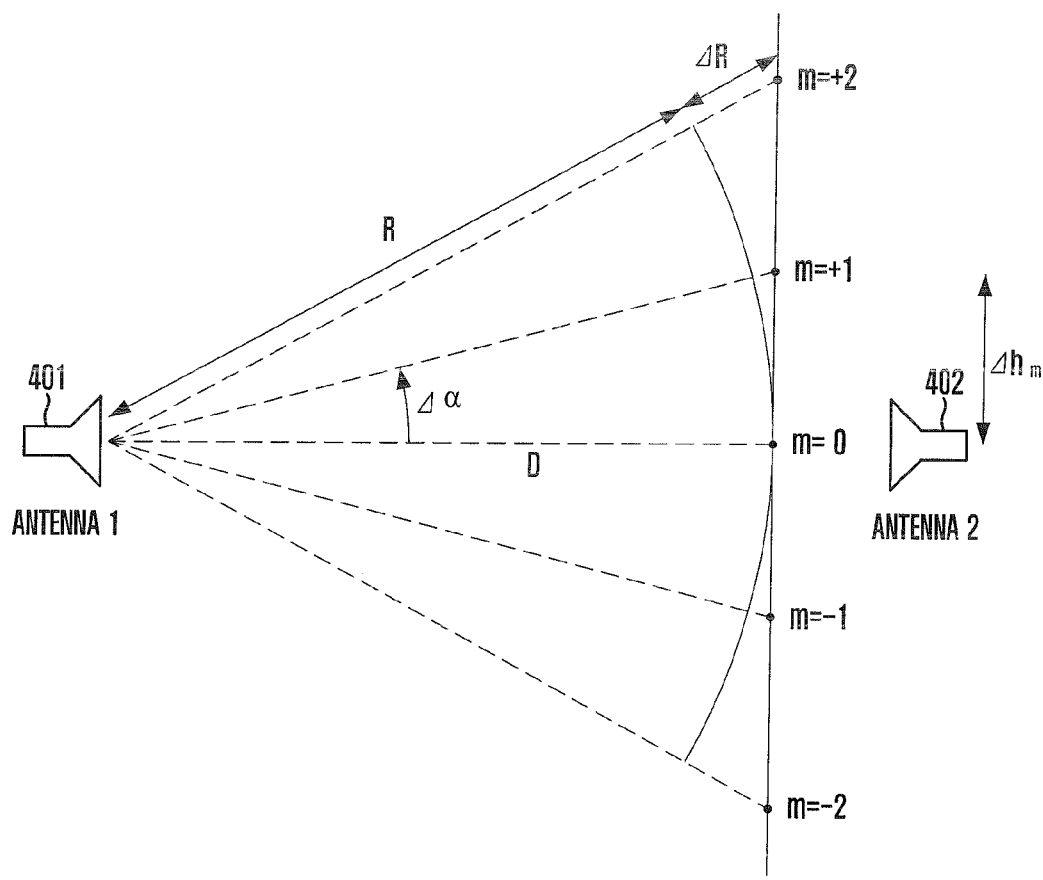
FIG. 4 illustrates a measuring technique of an antenna radiation pattern in a Fresnel region in accordance with an embodiment of the present invention.

FIG. 4 illustrates a measuring technique of an antenna radiation pattern in a Fresnel region in accordance with an embodiment of the present invention.

As shown in FIG. 4, it is assumed that a first measuring antenna 401 is a source antenna which outputs the RF signal generated in the VNA 70 and transmitted through the RF cable, and a second measuring antenna is a receiving antenna which acquires a far-field radiation pattern.

As described in equation 1, an electric field $E_{far}$ of a far-field region is acquired from a sum of electric fields of a Fresnel region having a far distance D and a Fourier coefficient $k_{mn}$ described in equation 5. In equation 5, $c=\sqrt{(\pi/\lambda R)}$, and a and b are coordinates of a center of a rectangular region having an amplitude of $T_x$ and $T_y$.

In equation 1, $C_{mm,D}$ is a compensation value to convert $E_D$ into an electric field value $E_R$ of a point having the same distance R. As shown in the equation 2, the $C_{mm,D}$ compensates size and phase values. Further, $C_{mm,s}$ is a compensation value for a first antenna 401 and should be considered since a pattern is changed according to an angle. As shown in the equations 3 and 4, $\Delta\alpha$ and $\Delta\beta$ are an increase/decrease value of the angle along the x-axis and y-axis directions.

$$E_{far}(\alpha, \beta) = \sum_{m=-M}^{+M} \sum_{n=-N}^{+N} [k_{mn} \cdot E_D(\alpha + m\Delta_\alpha, \beta + n\Delta_\beta) \cdot C_{mn,D} \cdot C_{mn,S}] \quad \text{Eq. 1}$$

$$C_{mn,D} = (1 + \Delta R/R) \angle (\beta \Delta R) \quad \text{Eq. 2}$$

$$\Delta\alpha = \lambda/T_x \quad \text{Eq. 3}$$

$$\Delta\beta = \lambda/T_y \quad \text{Eq. 4}$$

$$k_{mn} = \frac{1}{T_x T_y} \int_{-T_x/2+a}^{T_x/2+a} e^{-ic_1^2 u^2} e^{-i\frac{2\pi}{T_x}mu} du \int_{-T_y/2+b}^{T_y/2+b} e^{-ic_2^2 v^2} e^{-i\frac{2\pi}{T_y}nv} dv \quad \text{Eq. 5}$$

$$\Delta h_m = R \times \tan(\Delta\alpha \times |m|) \quad \text{Eq. 6}$$

Here, although the larger measuring cross sections M and N are, the more accurately the far-field radiation pattern is acquired. An optimum value is determined by the equation 5 since a measuring time increases. An amplitude $|k_{mn}|$ is acquired from $k_{mn}$ described in equation 5 by using a numerical value calculation program. $|k_{mn}|$ is decreased according to the increase of variables M and N, and it is determined that M and N are determined as optimum values of the measuring cross section when M and N are smaller as much as −10 dB than a maximum value.

Figure 5:
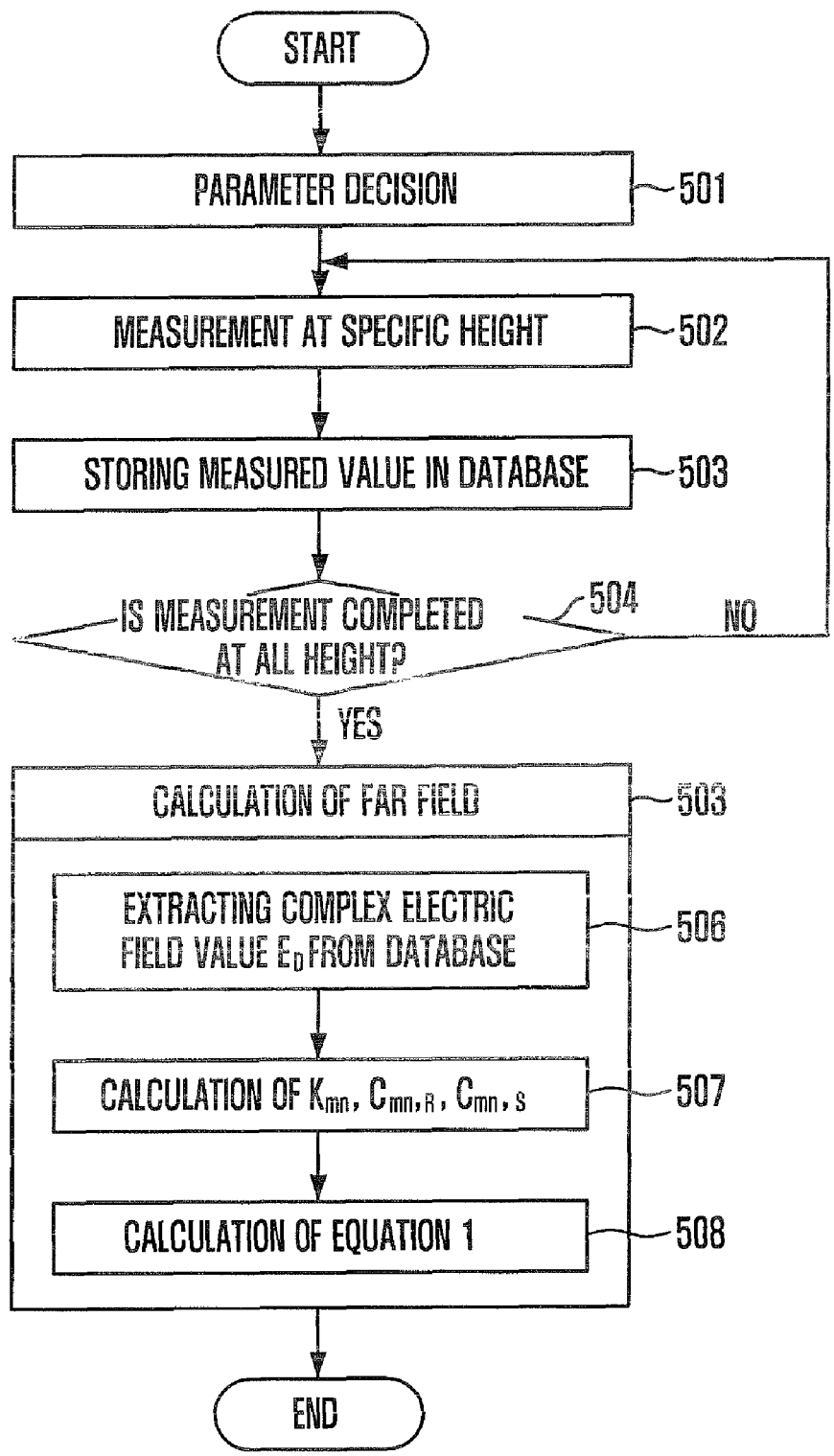
FIG. 5 is a flowchart illustrating a measuring method of an antenna radiation pattern in a Fresnel region in accordance with an embodiment of the present invention.

FIG. 5 is a flowchart illustrating a measuring method of an antenna radiation pattern in a Fresnel region in accordance with an embodiment of the present invention.

Firstly, a distance to 'Quiet zone' is measured, $\Delta\alpha$ and $\Delta\beta$ are determined based on the equations 3 and 4. As mentioned above, a measuring parameter is determined by acquiring the number of needed cross sections through an amplitude graph of $k_{mn}$ according to the variables M and N at step S501.

Then, the movable antenna 20 is moved to a specific height upward or downward. The radiation of the antenna is measured by the movable antenna 20, which is moved to the specific height, and the fixing antenna 10, which is fixed by horizontally rotating the rotation axis 40 through the rotation device 50 at step S502. The VNA 70 reads and stores a complex value in a database at step S503.

The steps S502 and S503 are performed at all cross sections (height) except the specific height at step S504.

Next, the far-field radiation pattern is calculated by the equations 1 to 5 at step S505.

The step S505 will be described in more details. A needed complex electric field value $E_D$ is extracted from the database at step S506. The Fourier coefficient $k_{mn}$, the compensation efficients $C_{mm,D}$ and $C_{mm,s}$ are calculated at step S507, and the far-field radiation pattern is acquired by the equation 1 at step S508.

In the present invention, an antenna radiation pattern technology is proved by measuring the radiation pattern of a standard horn antenna in the Fresnel region and a distance satisfied in a far-field condition. Moreover, in the present invention, a minimum distance of the far-field is set to 2.33 m by $D_{far}=2L^2/\lambda$, a reference far-field radiation pattern is set by measuring a radiation of antenna at 8 m where is as far as 3.4 times than 2.33 m. Further, the far-field radiation pattern is acquired by measuring the radiation of the same antenna in Fresnel region at a distance D=0.5 m according to the present invention.

Figure 6:
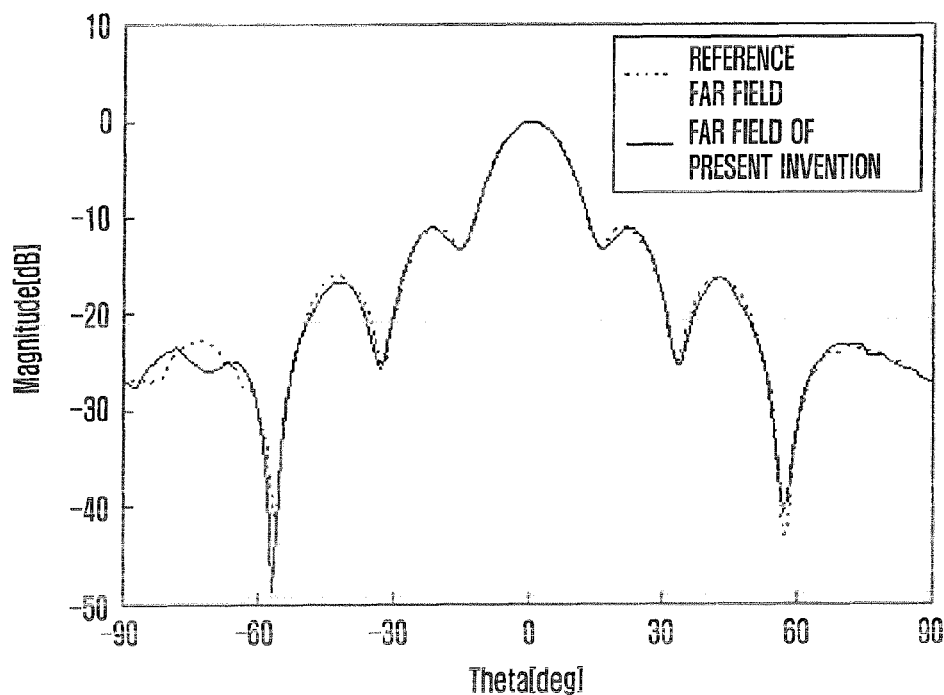
FIG. 6 is a graph illustrating a comparison of a far-field radiation pattern of an E-plane basis with a far-field radiation pattern in accordance with the present invention.
Figure 7:
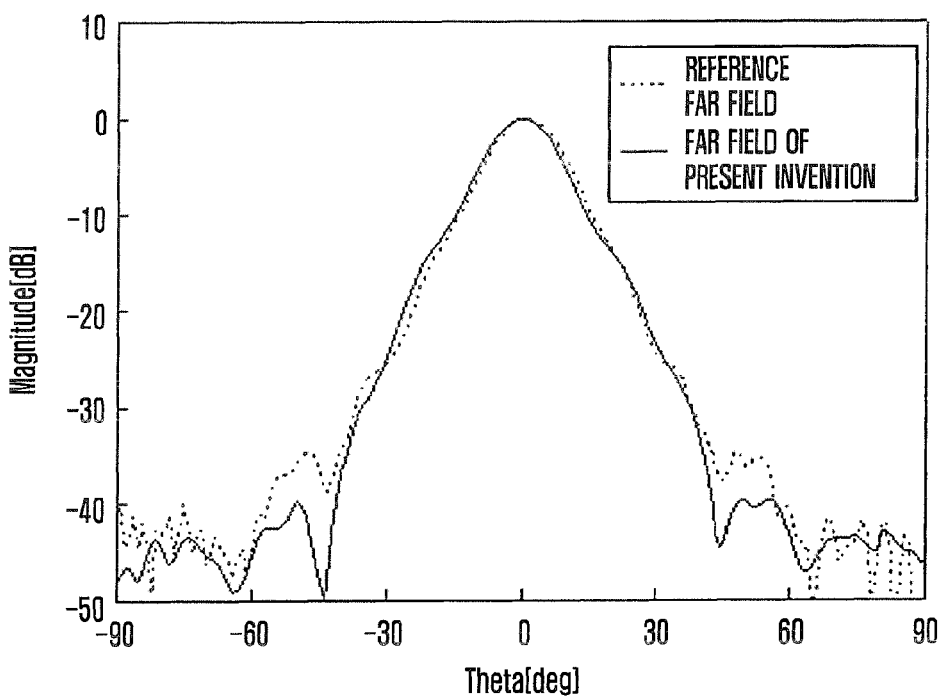
FIG. 7 is a graph illustrating a comparison of a far-field radiation pattern of an H-plane basis with a far-field radiation pattern in accordance with the present invention.

FIG. 6 is a graph illustrating a comparison of a far-field radiation pattern of an E-plane basis with a far-field radiation pattern in accordance with the present invention, and FIG. 7 is a graph illustrating a comparison of a far-field radiation pattern of an H-plane basis with a far-field radiation pattern in accordance with the present invention.

As shown in FIG. 6, the far-field radiation pattern of the E-plane basis is nearly same with the far-field radiation pattern according to the present invention. Moreover, the far-field radiation pattern of an H-plane basis and the far-field radiation pattern in accordance with the present invention are nearly same with each other up to a level of −35 dB.

The above described method according to the present invention can be embodied as a program and stored on a computer readable recording medium. The computer readable recording medium is any data storage device that can store data which can be thereafter read by the computer system. The computer readable recording medium includes a read-only memory (ROM), a random-access memory (RAM), a CD-ROM, a floppy disk, a hard disk and an optical magnetic disk.

While the present invention has been described with respect to certain preferred embodiments, it will be apparent to those skilled in the art that various changes and modifications may be made without departing from the scope of the invention as defined in the following claims.

What is claimed is:

1. A system for measuring an antenna radiation pattern in a Fresnel region, comprising:
   a fixed antenna and a movable antenna located in the Fresnel region for acquiring a far-field radiation pattern;
   a moving means moving upward or downward, for adjusting a measuring angle of the movable antenna;
   a rotation means for rotating a rotation shaft horizontally;
   a vector network analyzing means for outputting an radio frequency (RF) signal to one of the fixed antenna and the movable antenna as a transmission antenna, receiving the RF signal received through the other as a receiving antenna, and detecting a complex value;
   a control and communication means for controlling the vector network analyzing means and a control means, and performing a data communication; and
   the control means for providing a vertical/horizontal rotation force to the moving means and the rotation means under a control of the control and communication means,
   wherein the fixed and movable antennas are spaced apart by a fixed horizontal distance D, and
   wherein the vector network analyzing means calculates the antenna radiation pattern based on the detected complex value, a Fourier coefficient, a compensation coefficient $C_{mm,D}$ for converting a complex value $E_D$ detected at the receiving antenna into an equivalent complex value $E_R$ detected at a distance R from the antenna outputting the RF signal, and a compensation coefficient $C_{mm,S}$ denoting a compensation value for the transmission antenna.

2. The system of claim 1, wherein the fixed antenna is attached to the rotation shaft and the movable antenna is attached to a fixed shaft.

3. The system of claim 1, the movable antenna is attached to the rotation shaft, and the fixed antenna is attached to a fixed shaft.

4. A method for measuring an antenna radiation pattern in a Fresnel region, comprising the steps of:
   determining a measuring parameter;
   changing a measuring height by moving a movable antenna upward or downward;
   measuring an antenna radiation by rotating a rotation shaft horizontally using the movable antenna at a predetermined height, acquiring a complex value and storing the acquired complex value in a database;

performing the step of measuring the antenna radiation by moving the movable antenna at all height; and calculating a far-field radiation pattern based on the acquired complex value stored in the database, a Fourier coefficient, a compensation coefficient $C_{mm,D}$ for converting a complex value $E_D$ acquired at a receiving antenna spaced a fixed horizontal distance D apart from a transmitting antenna into an equivalent complex value $E_R$ acquired at a distance R from the transmitting antenna, and a compensation coefficient $C_{mm,S}$ denoting a compensation value for the transmitting antenna.

5. The method of claim 4, wherein the measuring height of the movable antenna is acquired by a following equation 6 as:

$$\Delta h_m = R \times \tan(\Delta\alpha \times |m|) \qquad \text{Eq. 6.}$$

6. The method of claim 5, wherein in the far-field radiation pattern calculation step, the far-field radiation field is calculated by equation 1 based on the complex electric field value stored in the database, the Fourier coefficient of following equation 5, and the compensation coefficients $C_{mm,D}$ and $C_{mm,S}$ of following equations 1 and 2 as:

$$E_{far}(\alpha, \beta) = \sum_{m=-M}^{+M} \sum_{n=-N}^{+N} [k_{mn} \cdot E_D(\alpha + m\Delta_\alpha, \beta + n\Delta_\beta) \cdot C_{mn,D} \cdot C_{mn,S}] \qquad \text{Eq. 1}$$

$$C_{mn,D} = (1 + \Delta R/R) L(\beta \Delta R) \qquad \text{Eq. 2}$$

$$k_{mn} = \frac{1}{T_x T_y} \int_{-T_x/2+a}^{T_x/2+a} e^{-ic_1^2 u^2} e^{-i\frac{2\pi}{T_x}mu} du \int_{-T_y/2+b}^{T_y/2+b} e^{-ic_2^2 v^2} e^{-i\frac{2\pi}{T_y}nv} dv \qquad \text{Eq. 5}$$

where $E_{far}$ denotes the electric field in the far-field region, and $E_D$ denotes the electric field in a Fresnel region having a far distance D, and where $k_{mn}$ denotes the Fourier coefficient, and a and b denote the coordinates of the center of the rectangular region having an amplitude of $T_x$ and $T_y$, and $\Delta\alpha$ and $\Delta\beta$ denote the increase/decrease value of the angle along the x-axis and y-axis directions.

7. The method of claim 6, wherein the cross sections M and N of equation 5 is calculated by using a correlation of an absolute value $|k_{mn}|$ of the Fourier coefficient with the cross sections M and N, and is corresponding to the absolute value of the Fourier coefficient which is reduced as much as a predetermined Fourier coefficient from the maximum value of the absolute value of the Fourier coefficient.

* * * * *